(12) United States Patent
Kitamura et al.

(10) Patent No.: US 12,198,957 B2
(45) Date of Patent: Jan. 14, 2025

(54) COMMUNICATION METHOD, TRANSPORT SYSTEM, AND COMMUNICATION DEVICE

(71) Applicant: MURATA MACHINERY, LTD., Kyoto (JP)

(72) Inventors: Wataru Kitamura, Inuyama (JP); Munekuni Oshima, Ise (JP); Tetsuya Kuwahara, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 957 days.

(21) Appl. No.: 17/251,245

(22) PCT Filed: Apr. 19, 2019

(86) PCT No.: PCT/JP2019/016815
§ 371 (c)(1),
(2) Date: Dec. 11, 2020

(87) PCT Pub. No.: WO2019/244466
PCT Pub. Date: Dec. 26, 2019

(65) Prior Publication Data
US 2021/0265184 A1    Aug. 26, 2021

(30) Foreign Application Priority Data
Jun. 20, 2018    (JP) .................. 2018-116545

(51) Int. Cl.
*H01L 21/67* (2006.01)
*B65G 1/04* (2006.01)
(Continued)

(52) U.S. Cl.
CPC ...... *H01L 21/67276* (2013.01); *B65G 1/0457* (2013.01); *H01L 21/67724* (2013.01);
(Continued)

(58) Field of Classification Search
CPC . B60W 30/06; B60W 60/00; H04L 21/67276; H04L 21/67724; H04B 17/318;
(Continued)

(56) References Cited

U.S. PATENT DOCUMENTS

2009/0190553 A1    7/2009 Masuda et al.
2013/0079920 A1*   3/2013 Tokumoto ......... H01L 21/67276
                                                    700/228
(Continued)

FOREIGN PATENT DOCUMENTS

JP    4471118 B2    6/2010
JP    5682835 B2    3/2015
(Continued)

OTHER PUBLICATIONS

Official Communication issued in corresponding Chinese Patent Application No. 201980037843.X, mailed on Sep. 3, 2021.

*Primary Examiner* — Iqbal Zaidi
(74) *Attorney, Agent, or Firm* — Keating & Bennett, LLP

(57) ABSTRACT

A communication method of a transport system including of transport carriages each transporting a transported object, and communication devices connected one-to-one with loading ports onto which the transported objects are loaded. The communication devices are communicably connected to each other in advance. The communication method includes transmitting, from a specific transport carriage to the communication devices, a first signal having a specific communication as a final transmission destination, and receiving, in the specific communication device, the first signal from the specific transport carriage through a communication channel that passes through another communication device. The first signal is a signal communicated for the specific transport
(Continued)

carriage to transfer the transported object to and from a specific loading port connected one-to-one with the specific communication device.

22 Claims, 6 Drawing Sheets

(51) Int. Cl.
    *H01L 21/677*     (2006.01)
    *H04B 17/318*     (2015.01)
    *H04L 67/12*     (2022.01)

(52) U.S. Cl.
    CPC ..... *H01L 21/67733* (2013.01); *H04B 17/318* (2015.01); *B65G 2201/0297* (2013.01); *H04L 67/12* (2013.01)

(58) Field of Classification Search
    CPC ............ H01L 21/6733; G06Q 10/0835; G06Q 10/0836; B23P 21/004; B23P 19/04
    See application file for complete search history.

(56) References Cited

U.S. PATENT DOCUMENTS

| | | |
|---|---|---|
| 2016/0050649 A1 | 2/2016 | Park et al. |
| 2016/0276192 A1 | 9/2016 | Tanimoto |
| 2017/0127405 A1 | 5/2017 | Agiwal et al. |
| 2019/0070846 A1* | 3/2019 | Reinsch ............... B65H 29/243 |
| 2019/0092578 A1* | 3/2019 | Umeyama ............... B60L 13/03 |
| 2019/0160609 A1* | 5/2019 | Nakamura ............. B65G 37/02 |
| 2021/0227536 A1 | 7/2021 | Agiwal et al. |

FOREIGN PATENT DOCUMENTS

| | | |
|---|---|---|
| JP | 2015-087790 A | 5/2015 |
| KR | 10-0862356 B1 | 10/2008 |
| KR | 10-2016-0021626 A | 2/2016 |
| KR | 10-2017-0051347 A | 5/2017 |
| WO | 2011/155040 A1 | 12/2011 |

* cited by examiner

COMMUNICATION METHOD, TRANSPORT SYSTEM, AND COMMUNICATION DEVICE

BACKGROUND OF THE INVENTION

1. Field of the Invention

The present invention relates to a communication method of a transport system, a transport system, and a communication device.

2. Description of the Related Art

A system including overhead traveling carriages that transport semiconductor wafers or the like and semiconductor manufacturing apparatuses that process the semiconductor wafers or the like has been disclosed (see, for example, International Publication No. 2011/155040 and Japanese Patent No. 4471118). The overhead traveling carriage stops traveling above a loading port provided in the semiconductor manufacturing apparatus, and transfers semiconductor wafers or the like to and from the loading port. An optical communication terminal connected to the semiconductor manufacturing apparatus is provided above the stopping position of the overhead traveling carriage. Upon stopping, the overhead traveling carriage communicates with the optical communication terminal for the purpose of transferring the semiconductor wafers or the like (communication for performing interlock processing; also referred to as "interlock communication"). Accordingly, when, for example, transferring semiconductor wafers or the like to the loading port, the overhead traveling carriage will not move to the next step unless a specific condition is satisfied, and the transfer of semiconductor wafers or the like from the overhead traveling carriage to the loading port can therefore be performed safely and reliably.

The interlock communication is executed through optical communication in the above-described system. With optical communication, it is necessary to align optical axes between the overhead traveling carriage and the optical communication terminal. Communication problems caused by skew between the optical axes may therefore arise.

The inventors of the present invention examined the of wireless communication such as Wi-Fi (registered use trademark) instead of optical communication. Specifically, the semiconductor manufacturing apparatus is provided with a communication device, and the overhead traveling carriage executes the interlock communication through wireless communication with the communication device. With wireless communication, there is no need to align optical axes, which eliminates communication problems caused by skew between the optical axes.

However, with wireless communication, communication failures may occur due to radio wave reflection and the like caused by the surrounding environment, and it is therefore necessary to provide redundant wireless communication.

SUMMARY OF THE INVENTION

Preferred Embodiments of the Present Invention provide communication methods and the like which are able to provide redundant wireless communication in interlock communication in transport systems.

A communication method according to a preferred embodiment of the present invention is a communication method of a transport system, the transport system including a plurality of transport carriages, each transporting a transported object, and a plurality of communication devices connected one-to-one with corresponding ones of a plurality of equipment onto which the transported objects are loaded. The plurality of communication devices are communicably connected to each other in advance. The communication method includes: (a) transmitting, from a specific transport carriage among the plurality of transport carriages to the plurality of communication devices, a first signal having a specific communication device among the plurality of communication devices as a final transmission destination; and (b) receiving, in the specific communication device, the first signal from the specific transport carriage through a communication channel that passes through at least one other communication device among the plurality of communication devices. The first signal is a signal communicated for the specific transport carriage to transfer the transported object to and from a specific one of the equipment which is connected one-to-one with the specific communication device.

Accordingly, even if the specific communication device is not able receive the first signal directly from the specific transport carriage due to a communication failure, the specific communication device is able to indirectly receive the first signal through a communication channel that passes through another communication device. Therefore, redundant wireless communication is able to be provided in interlock communication in the transport system.

Additionally, the plurality of communication devices may be connected to each other by a hardwire cable.

Accordingly, more stable communication among the plurality of communication devices is able to be provided than when using wireless connections.

Additionally, the plurality of communication devices may be at least three communication devices; the first signal may include time information identifying a time for each of the at least one other communication device to transmit the first signal to the specific communication device; and in (b), each of the at least one other communication device may transmit the first signal to the specific communication device at the time identified by the time information.

Accordingly, a situation where each of the other communication devices transmits the first signal to the specific communication device at the same time is able to be significantly reduced or prevented, and thus the occurrence of collisions is able to be significantly reduced or prevented.

Additionally, in (b), each of the at least one other communication device may transmit the first signal to the specific communication device, and the communication method may further include (c) transmitting a second signal from the specific communication device to the specific transport carriage through a communication channel passing through the at least one other communication device, the second signal being a response signal responding to the first signal.

Accordingly, even if the specific transport carriage is not able to receive the second signal directly from the specific communication device due to a communication failure, the specific transport carriage is able to indirectly receive the second signal through a communication channel that passes through another communication device.

Additionally, the plurality of communication devices may be at least three communication devices; the first signal may include a radio wave strength at which each of the at least one other communication device has received the first signal from the specific transport carriage; in (b), each of the at least one other communication device may transmit the first signal including the radio wave strength to the specific communication device; and in (c), the specific communication device may transmit the second signal to the specific transport carriage through a communication channel that passes through a communication device, among the at least one other communication device, that corresponds to the radio wave strength that is the strongest radio wave strength included in the first signal transmitted by the at least one other communication device.

Accordingly, the second signal is transmitted through the communication channel, of the communication channels that pass through the other communication devices, that has the strongest radio wave strength, and the likelihood that the communication between the specific transport carriage and the specific communication device will succeed is able to be significantly increased.

Additionally, a transport system according to a preferred embodiment of the present invention is a transport system including a plurality of transport carriages, each transporting a transported object, and a plurality of communication devices connected one-to-one with corresponding ones of a plurality of equipment onto which the transported objects are loaded. The plurality of communication devices are communicably connected to each other in advance. A specific transport carriage among the plurality of transport carriages transmits, to the plurality of communication devices, a first signal having a specific communication device among the plurality of communication devices as a final transmission destination. The specific communication device receives the first signal from the specific transport carriage through a communication channel that passes through at least one other communication device among the plurality of communication devices. The first signal is a signal communicated for the specific transport carriage to transfer the transported object to and from a specific one of the equipment which is connected one-to-one with the specific communication device.

Accordingly, even if the specific communication device is not able to receive the first signal directly from the specific transport carriage due to a communication failure, the specific communication device is able to indirectly receive the first signal through a communication channel that passes through another communication device. Therefore, redundant wireless communication is able to be provided in interlock communication in the transport system.

Additionally, the plurality of communication devices may be connected to each other by a hardwire cable.

Accordingly, more stable communication among the plurality of communication devices is able to be provided than when using wireless connections.

Additionally, the plurality of communication devices may be at least three communication devices; the first signal may include time information identifying a time for each of the at least one other communication device to transmit the first signal to the specific communication device; and the specific communication device may receive the first signal from the specific transport carriage through a communication channel passing through the at least one other communication device by each of the at least one other communication device transmitting the first signal to the specific communication device at the time identified by the time information.

Accordingly, a situation where each of the other communication devices transmits the first signal to the specific communication device at the same time is able to be significantly reduced or prevented, and thus the occurrence of collisions is able to be significantly reduced or prevented.

Additionally, the specific communication device may receive the first signal from the specific transport carriage through a communication channel passing through the at least one other communication device by each of the at least one other communication device transmitting the first signal to the specific communication and device; the specific communication device may transmit a second signal to the specific transport carriage through a communication channel passing through the at least one other communication device, the second signal being a response signal responding to the first signal.

Accordingly, even if the specific transport carriage is not able to receive the second signal directly from the specific communication device due to a communication failure, the specific transport carriage is able to indirectly receive the second signal through a communication channel that passes through another communication device.

Additionally, the plurality of communication devices may be at least three communication devices; the first signal may include a radio wave strength at which each of the at least one other communication device has received the first signal from the specific transport carriage; the specific communication device may receive the first signal from the specific transport carriage through a communication channel passing through the at least one other communication device by each of the at least one other communication device transmitting the first signal including the radio wave strength to the specific communication device; and the specific communication device may transmit the second signal to the specific transport carriage through a communication channel that passes through a communication device, among the at least one other communication device, that corresponds to the radio wave strength that is the strongest radio wave strength included in the first signal transmitted by the at least one other communication device.

Accordingly, the second signal is transmitted through the communication channel, of the communication channels that pass through the other communication devices, that has the strongest radio wave strength, and the likelihood that the communication between the specific transport carriage and the specific communication device will succeed is able to be significantly increased.

Additionally, a communication device according to a preferred embodiment of present invention is a communication device in a transport system, the transport system including a plurality of transport carriages, each transporting a transported object, and a plurality of the communication devices connected one-to-one with corresponding ones of a plurality of equipment onto which the transported objects are loaded. The plurality of communication devices are communicably connected to each other in advance. When a specific transport carriage among the plurality of transport carriages has transmitted, to the plurality of communication devices, a first signal having the communication device among the plurality of communication devices as a final transmission destination, the communication device receives the first signal from the specific transport carriage through a communication channel passing through at least one other communication device among the plurality of communication devices. The first signal is a signal communicated for the specific transport carriage to transfer the transported object to and from a specific one of the equipment which is connected one-to-one with the communication device.

Accordingly, even if the communication device is not able to receive the first signal directly from the specific transport carriage due to a communication failure, the communication device is able to indirectly receive the first signal through a communication channel that passes through another communication device. Therefore, redundant wireless communication is able to be provided in interlock communication in the transport system.

Additionally, the plurality of communication devices may be connected to each other by a hardwire cable.

Accordingly, more stable communication among the plurality of communication devices is able to be provided than when using wireless connections.

Additionally, the plurality of communication devices may be at least three communication devices; the first signal may include time information identifying a time for each of the at least one other communication device to transmit the first signal to the communication device; and the communication device may receive the first signal from the specific transport carriage through a communication channel passing through the at least one other communication device by each of the at least one other communication device transmitting the first signal to the communication device at the time identified by the time information.

Accordingly, a situation where each of the other communication devices transmits the first signal to the communication device at the same time is able to be significantly reduced or prevented, and thus the occurrence of collisions is able to be significantly reduced or prevented.

Additionally, the communication device may receive the first signal from the specific transport carriage through a communication channel passing through the at least one other communication device by each of the at least one other communication device transmitting the first signal to the communication device; and the communication device may transmit a second signal to the specific transport carriage through a communication channel passing through the at least one other communication device, the second signal being a response signal responding to the first signal.

Accordingly, even if the specific transport carriage is not able to receive the second signal directly from the communication device due to a communication failure, the specific transport carriage is able to indirectly receive the second signal through a communication channel that passes through another communication device.

Additionally, the plurality of communication devices may be at least three devices; the first signal may include a radio wave strength at which each of the at least one other communication device has received the first signal from the specific transport carriage; the communication device may receive the first signal from the specific transport carriage through a communication channel passing through the at least one other communication device by each of the at least one other communication device transmitting the first signal including the radio wave strength to the communication device; and the communication device may transmit the second signal to the specific transport carriage through a communication channel that passes through a communication device, among the at least one other communication device, that corresponds to the radio wave strength that is the strongest radio wave strength included in the first signal transmitted by the at least one other communication device.

Accordingly, the second signal is transmitted through the communication channel, of the communication channels that pass through the other communication devices, that has the strongest radio wave strength, and the likelihood that the communication between the specific transport carriage and the communication device will succeed is able to be significantly increased.

Additionally, when a specific transport carriage among the plurality of transport carriages has transmitted, to the plurality of communication devices, a first signal having as a final transmission destination a specific communication device, among the plurality of communication devices, that is different from the communication device, the communication device may transmit the first signal received from the transport carriage to the specific communication device.

Accordingly, when the communication device receives, from the specific transport carriage, a first signal that is not addressed to the communication device itself, the communication device transmits (transfers) the first signal to the specific communication device. In other words, even if the specific communication device is not able to receive the first signal directly from the specific transport carriage due to a communication failure, the specific communication device is able to indirectly receive the first signal through a communication channel that passes through the communication device. Therefore, redundant wireless communication is able to be provided in interlock communication in the transport system.

A communication method according to a preferred embodiment of the present invention is a communication method of a transport system, the transport system including a plurality of transport carriages, each transporting a transported object, and a plurality of communication devices connected one-to-one with corresponding ones of a plurality of equipment onto which the transported objects are loaded. The communication method includes: (a) transmitting, from a specific transport carriage among the plurality of transport carriages to at least one of (i) the plurality of communication devices and (ii) at least one other transport carriage of the plurality of transport carriages, a first signal having a specific communication device among the plurality of communication devices as a final transmission destination; and (b) receiving, in the specific communication device, the first signal through at least one of a communication channel passing through at least one other communication device among the plurality of communication devices and a communication channel passing through the at least one other transport carriage. The first signal is a signal communicated for the specific transport carriage to transfer the transported object to and from a specific one of the equipment which is connected one-to-one with the specific communication device.

Accordingly, even if the specific communication device is not able to receive the first signal directly from the specific transport carriage due to a communication failure, the specific communication device is able to indirectly receive the first signal through at least one of a communication channel that passes through another communication device and a communication channel that passes through another transport carriage. Therefore, redundant wireless communication is able to be provided in interlock communication in the transport system.

According to the communication methods and the like of preferred embodiments of the present invention, redundant wireless communication is able to be provided in interlock communications in transport systems.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
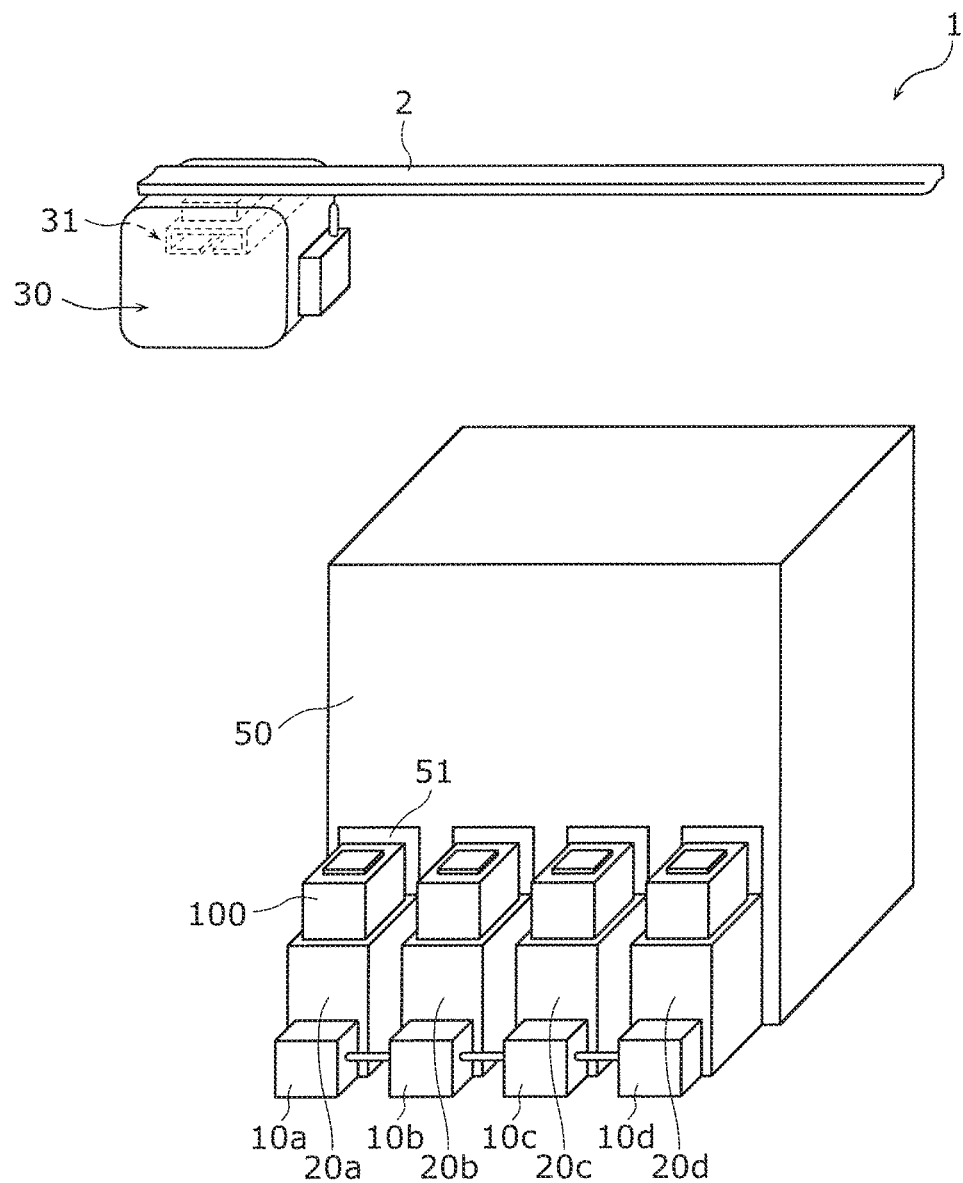
FIG. 1 is an exterior view illustrating an overview of a transport system according to Preferred Embodiment 1 of the present invention.

Preferred embodiments will be described in detail hereinafter with reference to the drawings.

All of the following preferred embodiments describe specific examples of the present invention. The numerical values, shapes, materials, elements, arrangements and connection states of elements, steps, orders of steps, and the like in the following preferred embodiments are merely examples, and are not intended to limit the present invention. Additionally, of the elements in the following preferred embodiments, elements not denoted in the independent claims, which express the broadest interpretation of the present invention, will be described as optional elements that provide further preferred embodiments. Identical elements may be given identical reference numerals, and descriptions thereof may be omitted.

Preferred Embodiment 1 of the present invention will be described hereinafter with reference to FIGS. 1 to 6.

FIG. 1 is an exterior view illustrating an overview of transport system 1 according to Preferred Embodiment 1. FIG. 1 is a schematic diagram, and the actual sizes of the elements are not limited to those illustrated in FIG. 1. Transport system 1 is a system to transfer a transported object, and includes: a plurality of transport carriages to transport transported objects; a plurality of communication devices which are connected one-to-one to corresponding ones of a plurality of equipment onto which the transported objects are loaded; and travel route 2 for the plurality of transport carriages to travel. FIG. 1 illustrates one transport carriage 30 of the plurality of transport carriages. FIG. 1 also illustrates semiconductor manufacturing apparatus 50. Although not an element of transport system 1 in the present preferred embodiment, semiconductor manufacturing apparatus 50 may be included as an element of transport system 1.

In the present preferred embodiment, the equipment includes loading ports. FIG. 1 illustrates a plurality of communication devices 10a to 10d and a plurality of loading ports 20a to 20d. Communication device 10a and loading port 20a have a one-to-one connection, communication device 10b and loading port 20b have a one-to-one connection, communication device 10c and loading port 20c have a one-to-one connection, and communication device 10d and loading port 20d have a one-to-one connection. In the following, each of the plurality of communication devices will also be referred to as "communication devices 10", and each of the plurality of loading ports will also be referred to as "loading ports 20". In the present preferred embodiment, the plurality of communication devices 10 are at least three communication devices 10.

Semiconductor manufacturing apparatus 50 illustrated in FIG. 1 is an apparatus that processes semiconductor wafers, and includes FOUP intake/discharge port 51 to take in and discharge FOUP (Front Opening Unified Pod) 100 in which a semiconductor wafer is stored. FOUP 100 corresponds to the transported object transported by transport system 1.

Loading port 20 is a port onto which FOUP 100, which is the transported object, is loaded; is located near FOUP intake/discharge port 51 of semiconductor manufacturing apparatus 50; and exchanges FOUP 100 with semiconductor manufacturing apparatus 50. FOUP 100 is transferred between loading port 20 and transport carriage 30. For example, loading port 20 transmits and receives signals to and from communication device 10 over a hardwire cable. Here, the one semiconductor manufacturing apparatus 50 is provided with, for example, four loading ports 20, and each loading port 20 is connected one-to-one to one communication device 10. As such, the one semiconductor manufacturing apparatus 50 and a plurality of (here, four) communication devices 10 are connected via a plurality of (here, four) loading ports 20.

Transport carriage 30 is a carriage that transfers FOUP 100 to and from loading port 20 and transports FOUP 100 along travel route 2, and includes gripper 31 which grips FOUP 100 on the inside of transport carriage 30. Gripper 31 is able to ascend and descend, for example, and descends adjacent to or in a vicinity of loading port 20 when transferring FOUP 100 to and from loading port 20. Gripper 31 may be mobile in a horizontal direction.

Communication device 10 is a communication device that relays the transmission and reception of signals communicated to transfer the transported object between loading port 20 and transport carriage 30, specifically, signals related to interlock processing (a first signal, and a second signal which is a response signal responding to the first signal). The first signal and the second signal are packets, for example. "Interlock processing" is processing which disables other operations unless a specific condition is satisfied. By performing interlock processing in transport system 1, when FOUP 100 is transferred to and from loading port 20 by transport carriage 30, the system is able to be disabled from moving to the next step unless a specific condition is satisfied. The "specific condition" is, for example, a condition that a specific transport carriage 30 has transmitted the first signal, which includes an instruction to confirm whether or not a specific loading port 20 to or from which FOUP 100 is to be transferred is currently in a state in which the transfer is possible (an interlock processing execution command), and has received the second signal, which includes a response indicating that the transfer is possible (a response to the interlock processing execution command) from the specific loading port 20. Accordingly, FOUP 100 is able to be transferred from the specific transport carriage 30 to the specific loading port 20 safely and reliably. Communication device 10 relays the exchange of the first signal and the second signal between transport carriage 30 and loading port 20. For example, communication device 10 transmits and receives the first signal and the second signal related to the interlock processing to and from loading port 20 over a hardwire cable. Communication device 10 and loading port 20 may transmit and receive the signals wirelessly. For example, communication device 10 is installed on a floor side of semiconductor manufacturing apparatus 50.

Additionally, communication device 10 wirelessly transmits and receives the first signal and the second signal related to the interlock processing to and from transport carriage 30. Communication device 10 and transport carriage 30 may communicate indirectly, via an access point or the like, or may communicate directly without using an access point or the like.

The plurality of communication devices 10a to 10d are communicably connected to each other in advance, and the first signal and the second signal related to the interlock processing are transmitted and received among the plurality of communication devices 10a to 10d. For example, the plurality of communication devices 10a to 10d are connected to each other by hardwire cables. For example, the plurality of communication devices 10a to 10d are connected to each other by a wired LAN (Local Area Network), RS-232-C, USB (Universal Serial Bus), or the like. Accordingly, more stable communication among the plurality of communication devices 10a to 10d is able to be provided than when using wireless connections. Note, however, that the plurality of communication devices 10a to 10d may be connected to each other wirelessly.

Operations and features of transport system 1 and semiconductor manufacturing apparatus 50 according to the present preferred embodiment will be described next.

Figure 2:
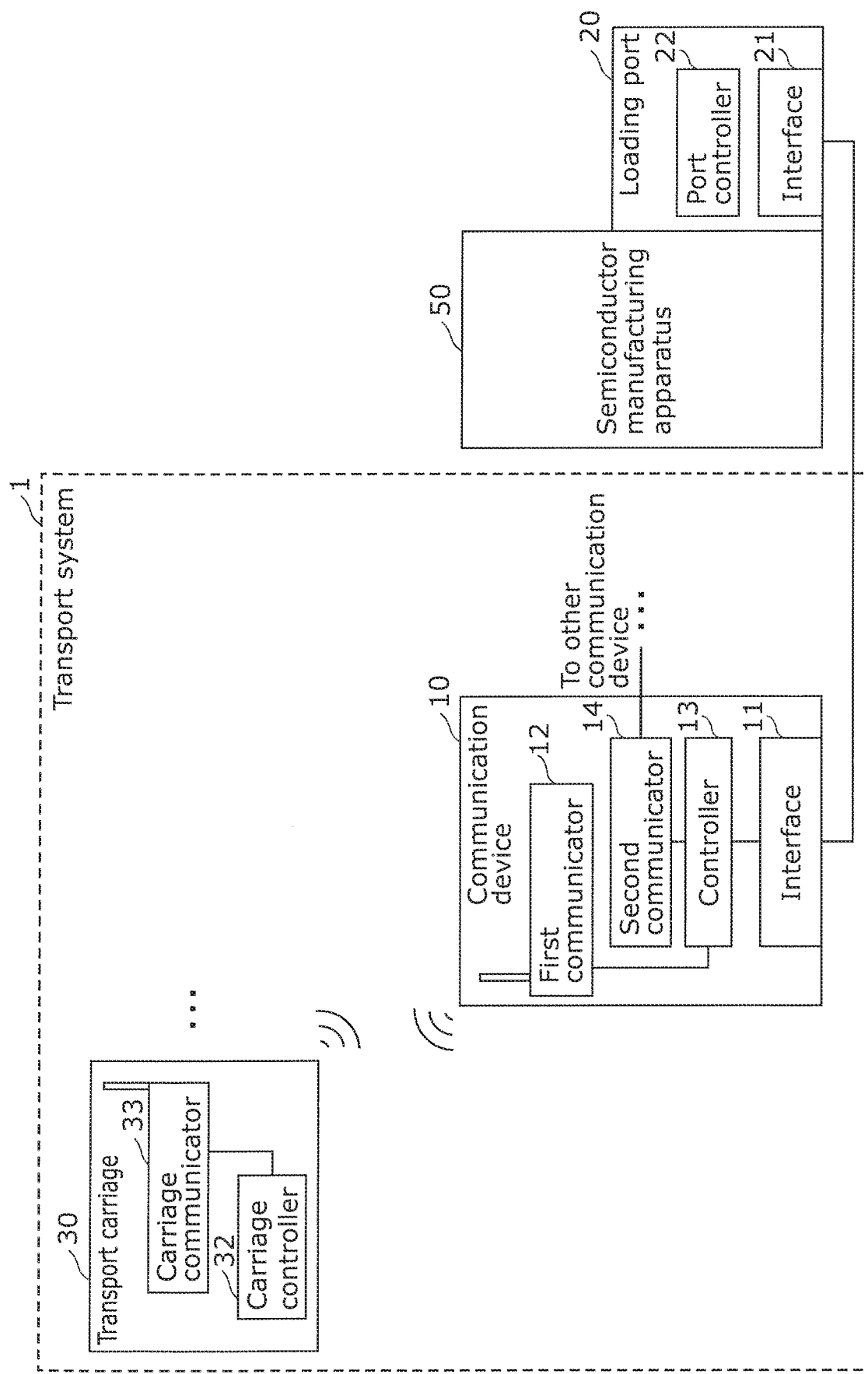
FIG. 2 is a block diagram illustrating the transport system and a semiconductor manufacturing apparatus according to Preferred Embodiment 1 of the present invention.

FIG. 2 is a block diagram illustrating the transport system 1 and semiconductor manufacturing apparatus 50 according to Preferred Embodiment 1.

First, the transport carriage 30 illustrated in FIG. 2 will be described. As illustrated in FIG. 2, transport carriage 30 includes carriage controller 32 and carriage communicator 33.

Carriage communicator 33 is a communication interface that communicates with communication device 10 over a network. Through carriage communicator 33, carriage controller 32 transmits, to communication device 10, signals communicated to transfer the transported object to and from the equipment (loading port 20) connected one-to-one to communication device 10. Specifically, through carriage controller 32 transmits, to communicator 33, carriage communication device 10, the first signal including the interlock processing execution command to transfer a transported object between loading port 20 and transport carriage 30. For example, carriage communicator 33 broadcasts the first signal to the plurality of communication devices 10a to 10d. Note, however, that carriage communicator 33 may unicast the first signal to each of the plurality of communication devices 10a to 10d. Carriage controller 32 also receives the second signal, which is a result of executing the above-described processing and is a response signal responding to the first signal, through carriage communicator 33.

Carriage controller 32 is a processor that controls carriage communicator 33, and that controls transport carriage 30 by communicating with the exterior (a communication device) through carriage communicator 33. Specifically, carriage controller 32 controls operations of transport carriage 30 by transmitting the first signal to carriage communicator 33 and then receiving the second signal from carriage communicator 33 (that is, confirming whether or not a specific loading port 20 is currently in a state in which transfer is possible).

Next, the loading port 20 illustrated in FIG. 2 will be described. As illustrated in FIG. 2, loading port 20 includes port controller 22 and interface 21.

Port controller 22 receives the first signal from interface 21 and confirms whether or not loading port 20 is currently in a state in which transfer is possible. Port which controller 22 then transmits the second signal, indicates whether or not loading port 20 is currently in a state in which transfer is possible, to interface 21.

Interface 21 is an input/output component or element that inputs and outputs signals, and includes, for example, a receptacle to connect a connector provided in a parallel cable (D-sub 25-pin or the like). For example, interface 21 may be based on the SEMI E84 standard. The signals input and output by interface 21 are compliant with communication standards such as the Centronics connector, IEEE 1284, and the like, for example.

Next, the communication device 10 illustrated in FIG. 2 will be described. As illustrated in FIG. 2, communication device 10 includes interface 11, first communicator 12, controller 13, and second communicator 14.

Interface 11 is an interface to communicate with loading port 20; includes, for example, an IO port which handles 8 bits in one direction (a total of 16 bits, bidirectionally); and is able to be connected to a parallel cable. Interface 11 uses the same communication standard as interface 21. With respect to communication device 10a as an example, interface 4 communication device 10a and interface 21 of loading port 20a are connected, and communication device 10a relays the exchange of the first signal and the second signal between transport carriage 30 and loading port 20a. The same or similar features apply to communication devices 10b to 10d. Accordingly, the plurality of communication devices 10a to 10d are connected one-to-one to the plurality of loading ports 20a to 20d, respectively. First communicator 12 is a communication interface that communicates with transport carriage 30 over a network. First communicator 12 includes an antenna, a transmission/reception circuit for wireless signals, and the like. First communicator 12 receives the first signal from transport carriage 30, and transmits the second signal to the transport carriage 30 via a wireless network for wireless communication (e.g., IEEE 802.11a, b, g, or n-compliant wireless LAN), for example. For example, first communicator 12 may be based on the SEMI E84 standard.

Second communicator 14 is a communication interface that communicates with other communication devices 10. Second communicator 14 is connected to second communicators 14 of the other communication devices 10 in advance, and as a result, the plurality of communication devices 10a to 10d are communicably connected to each other in advance. Additionally, for example, as described above, the plurality of communication devices 10a to 10d are connected to each other by hardwire cables, and second communicator 14 includes a connector to which the hardwire cable is connected, a signal transmission/reception circuit, and the like. For example, communication device 10 illustrated in FIG. 2 is communication device 10a, and second communicator 14 of communication device 10a is connected to second communicator 14 of communication device 10b. Second communicator 14 transmits and receives the first signal and the second signal to and from second communicators 14 of other communication devices 10. For example, the first signal and the second signal received from one communication device 10 among the other communication devices 10 (communication device 10b or the like) are transferred to another communication device 10 among the other communication devices 10 (communication device 10c or the like). For example, second communicator 14 may be based on the SEMI E84 standard.

Controller 13 is a processor that controls interface 11, first communicator 12, and second communicator 14. Controller 13 performs processing to execute the interlock processing to transfer FOUP 100 between loading port 20 and transport carriage 30.

The first signal includes a destination (for example, address information such as a MAC (Media Access Control) address, a logical address, or the like) indicating the specific communication device 10 that is the final destination of the interlock processing execution command from the specific transport carriage 30. Controller 13 confirms whether or not the destination included in the first signal received by first communicator 12 from the specific transport carriage 30 is communication device 10 including that controller 13. Controller 13 also measures a radio wave strength (e.g., RSSI (Received Signal Strength Indication)) when first communicator 12 receives the first signal from the specific transport carriage 30. Furthermore, controller 13 compares radio wave strength included in the first signal received by second communicator 14 from another communication device 10.

Controller 13 may be implemented by a processor executing a predetermined program, or by dedicated hardware.

A problem arising when signals related to the interlock processing exchanged are through wireless communication, and a method to address the problem, will be described next with reference to FIGS. 3 and 4.

Figure 3:
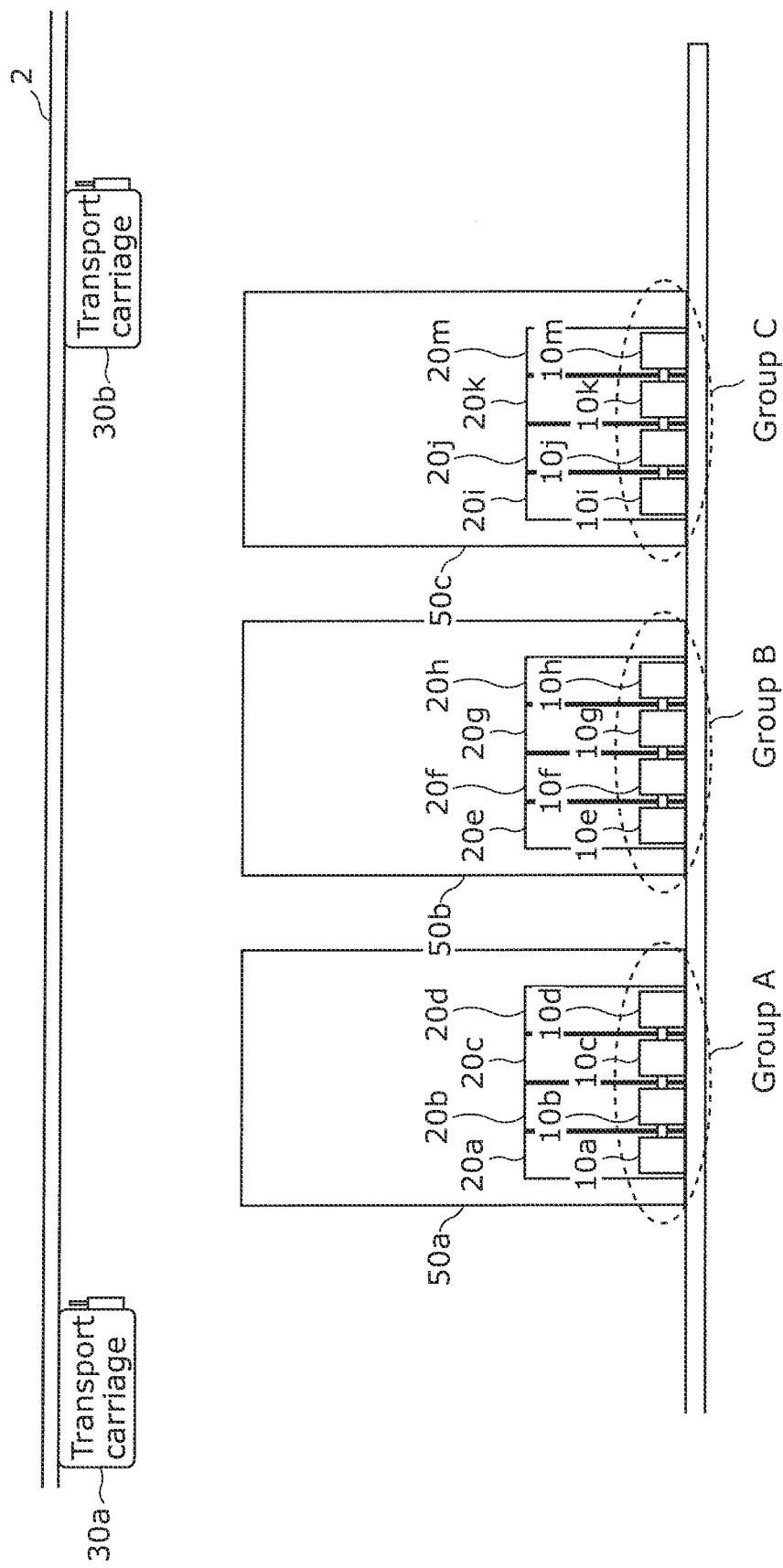
FIG. 3 is a diagram illustrating an example of the application of the transport system according to Preferred Embodiment 1 of the present invention.

FIG. 3 is a diagram illustrating an example of the application of the transport system according to Preferred Embodiment 1. FIG. 3 is a schematic diagram, and the actual sizes of the elements are not limited to those illustrated in FIG. 3.

In a semiconductor manufacturing factory or the like, a plurality of semiconductor manufacturing apparatuses 50 are installed, for example. For example, FIG. 3 illustrates semiconductor manufacturing 50a apparatuses to 50c. Semiconductor manufacturing apparatus 50a illustrated in FIG. 3 corresponds to semiconductor manufacturing apparatus 50 illustrated in FIG. 1. Transport carriages 30a and 30b are illustrated as a plurality of transport carriages 30. Semiconductor manufacturing apparatus 50a exchanges FOUPs 100 with each of loading ports 20a to 20d; semiconductor manufacturing apparatus 50b exchanges FOUPs 100 with each of loading ports 20e to 20h; and semiconductor manufacturing apparatus 50c exchanges FOUPs 100 with each of loading ports 20i to 20m. A plurality of communication devices 10a to 10m are connected one-to-one to loading ports 20a to 20m, respectively.

In a semiconductor manufacturing factory or the like, when signals related to interlock processing are transmitted and received through wireless communication, communication failures may occur due to radio wave reflection and the like caused by the surrounding environment, radio wave radiation from a variety of other devices including the plurality of semiconductor manufacturing apparatuses 50, communication dead points caused by overlapping radio waves, and the like. It is therefore necessary to provide redundant wireless communication for the interlock communication. Accordingly, in the present invention, the plurality of communication devices 10 are communicably connected to each other in advance in units of groups, as an example of one implementation to provide redundancy. For example, as illustrated in FIG. 3, the plurality of communication devices 10a to 10d are communicably connected to each other to define group A; the plurality of communication devices 10e to 10h are communicably connected to each other to define group B; and the plurality of communication devices 10i to 10m are communicably connected to each other to define group C. By grouping the plurality of communication devices 10 as described above, redundant wireless communication for the interlock communication is able to be provided. This will be described with reference to FIG. 4, using a specific example of the overall processing performed by transport system 1.

Figure 4:
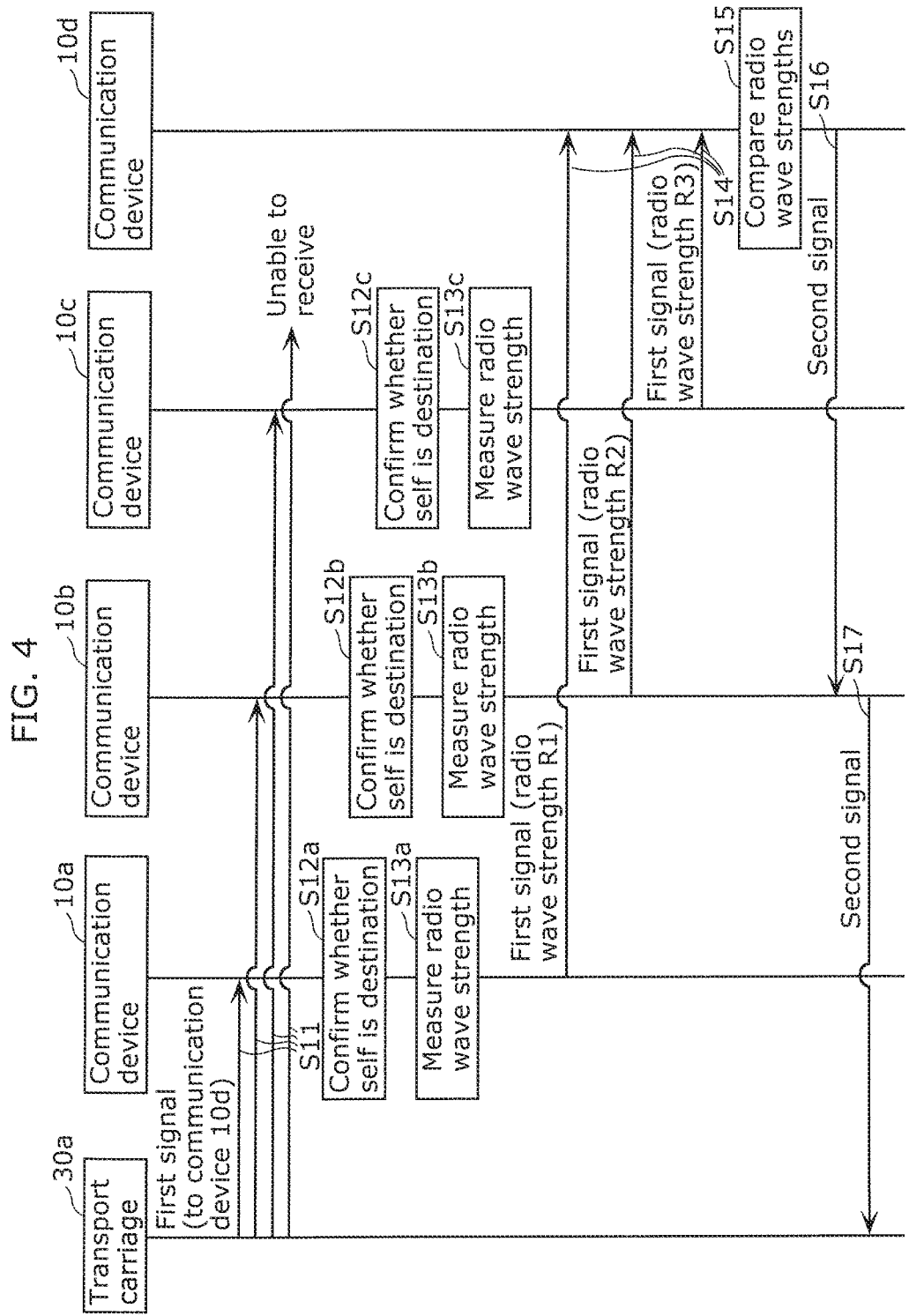
FIG. 4 is a sequence chart illustrating a first example of a communication method of the transport system according to Preferred Embodiment 1 of the present invention.

FIG. 4 is a sequence chart illustrating a first example of a communication method of transport system 1 according to Preferred Embodiment 1. Here, the specific transport carriage 30 that performs the interlock processing is transport carriage 30a. Furthermore, loading port 20 with which the specific transport carriage 30a transfers FOUP 100 is loading port 20d. In other words, the specific communication device 10 which is the destination of the first signal is communication device 10d, which is connected one-to-one with loading port 20d. In the following, of the plurality of communication devices 10a to 10d, communication devices 10 aside from the specific communication device 10d will be called "other communication devices 10a to 10c".

First, the specific transport carriage 30a among the plurality of transport carriages 30 transmits, to the plurality of communication devices 10a to 10d, the first signal, which has a final transmission destination of the specific communication device 10d among the plurality of communication devices 10a to 10d (step S11). Here, the specific transport carriage 30a broadcasts the first signal to the plurality of communication devices 10a to 10d. As illustrated in FIG. 4, although the other communication devices 10a to 10c successfully receive the first signal from the specific transport carriage 30a, communication device 10d, which is the final transmission destination, does not successfully receive the first signal from the specific transport carriage 30a due to a communication failure.

Although the plurality of communication devices 10e to 10m is also able to receive the first signal broadcast from the specific transport carriage 30a, the plurality of communication devices 10e to 10m confirm that the destination included in the first signal (communication device 10d) is a communication device 10 which does not belong to the groups B and C, that the groups to which the plurality of communication devices 10e to 10m belong, and therefore discard (ignore) the received first signal.

Next, controllers 13 of the other communication devices 10a to 10c which have received the first signal confirm whether or not the destination included in the first signal received by first communicators 12 from the specific transport carriage 30a is communication devices 10 including those controllers 13 (step S12a, step S12b, and step S12c). Here, the destination is communication device 10d, and thus each controller 13 confirms that the destination is communication device 10d as opposed to communication devices 10 including the controller 13. Accordingly, when the specific transport carriage 30a among the plurality of transport carriages 30 transmits, to the plurality of communication devices 10a to 10d, the first signal having a final transmission destination of the specific communication device 10d which, among the plurality of communication devices 10a to 10d, is different from the specific communication device 10d, the other communication devices 10a to 10c transmit, to the specific communication device 10d, the first signal received from the specific transport carriage 30a through communication channels that pass through the other communication devices 10a to 10c, in step S14.

Additionally, each controller 13 of the other communication devices 10a to 10c confirms the radio wave strength when the corresponding first communicator 12 receives the first signal from the specific transport carriage 30a (step S13a, step S13b, and step S13c). For example, communication device 10a measures radio wave strength R1 when receiving the first signal, communication device 10b measures radio wave strength R2 when receiving the first signal, and communication device 10c measures radio wave strength R3 when receiving the first signal. Each controller 13 of the other communication devices 10a to 10c then processes the first signal received by the corresponding first communicator 12 to include the measured radio wave strength in the first signal. Accordingly, the first signal transmitted by each of the other communication devices 10a to 10c in step S14, described later, includes the radio wave strength at which the signal was received.

Communication device 10a then transmits the first signal, including radio wave strength R1, to communication device 10d, which belongs to the same group A as communication device 10a and which is the final transmission destination. Likewise, communication device 10b transmits the first signal, including radio wave strength R2, to communication device 10d. Furthermore, communication device 10c transmits the first signal, including radio wave strength R3, to communication device 10d.

In addition to the address information of the specific communication device 10d which is the final transmission destination, the first signal transmitted by the specific transport carriage 30a to the plurality of communication devices 10a to 10d also includes time information identifying a time to transmit the first signal to the specific communication device 10d when each of the other communication devices 10a to 10c belonging to the same group A as the specific communication device 10d has received the first signal.

For example, in transport system 1, a system clock of each transport carriage 30 is synchronized with a system clock of each communication device 10. For example, the first signal transmitted to the plurality of communication devices 10a to 10d by the specific transport carriage 30a includes, as the time information, information indicating how many seconds after the present time the first signal is to be transmitted to the specific communication device 10d. Specifically, the first signal includes commands for communication device 10a to transmit the first signal to the specific communication device 10d about 1.0 ms after the present time, for communication device 10b to transmit the first signal to the specific communication device 10d about 1.5 ms after the present time, and for communication device 10c to transmit the first signal to the specific communication device 10d about 2.0 ms after the present time.

Accordingly, a situation where each of the other communication devices 10a to 10c transmits the first signal to the specific communication device 10d at the same time is able to be significantly reduced or prevented, and thus the occurrence of collisions is able to be significantly reduced or prevented.

Therefore, by each of the other communication devices 10a to 10c transmitting the first signal to the specific communication device 10d, and specifically, by transmitting the first signal to the specific communication device 10d at the time identified by the aforementioned time information, the specific communication device 10d receives the first signal from each of the other communication devices 10a to 10c. In other words, the specific communication device 10d receives the first signal from the specific transport carriage 30a through communication channels that pass through the other communication devices 10a to 10c (step S14). The communication channels pass that through the other communication devices 10a to 10c are communication channels defined by the channels through which the specific transport carriage 30a and the other communication devices 10a to 10c communicate, and the channels through which the other communication devices 10a to 10c and the specific communication device 10d communicate. In other words, the communication channels that pass through the other communication devices 10a to 10c are not channels through which the specific communication device 10d communicates directly with the specific transport carriage 30a without passing through the other communication devices 10a to 10c.

Accordingly, even if the specific communication device 10d is not able to receive the first signal directly from the specific transport carriage 30a due to a communication failure, the specific communication device 10d is able to indirectly receive the first signal through the communication channels that pass through the other communication devices 10a to 10c. Therefore, redundant wireless communication is able to be provided in the interlock communication in transport system 1.

The specific communication device 10d transmits the first signal to the specific loading port 20d connected one-to-one to the specific communication device 10d. Having received the first signal, loading port 20d confirms whether or not loading port 20d is currently in a state in which transfer is possible. Loading port 20d then returns, to the specific communication device 10d, the second signal indicating whether or not loading port 20d is currently in a state in which transfer is possible.

In the interlock processing, it is necessary to return, to the specific transport carriage 30a, a response (that is, the second signal) to the interlock processing execution command (that is, the first signal), and thus the specific communication device 10d transmits the second signal, which is a response signal responding to the first signal received from loading port 20d, to the specific transport carriage 30a. At that time, controller 13 of the specific communication device 10d compares radio wave strengths R1 to R3, which are included in the first signals transmitted from the other communication devices 10a to 10c. For example, controller 13 of the specific communication device 10d determines that radio wave strength R2 is the strongest of radio wave strengths R1 to R3.

The specific communication device 10d transmits the second signal to the specific transport carriage 30a through a communication channel that passes through communication device 10b, which of the other communication devices 10a to 10c, corresponds to radio wave strength R2 that is the strongest of radio wave strengths R1 to R3 included in the first signals transmitted from the other communication devices 10a to 10c. In other words, the specific communication device 10d transmits the second signal to communication device 10b (step S16), and communication device 10b transmits the second signal transmitted from the specific communication device 10d to the specific transport carriage 30a (step S17).

Accordingly, the second signal is transmitted through the communication channel, of the communication channels that pass through the other communication devices 10a to 10c, that has the strongest radio wave strength, and the likelihood that the communication between the specific transport carriage 30a and the specific communication device 10d will succeed is able to be significantly increased.

Figure 5:
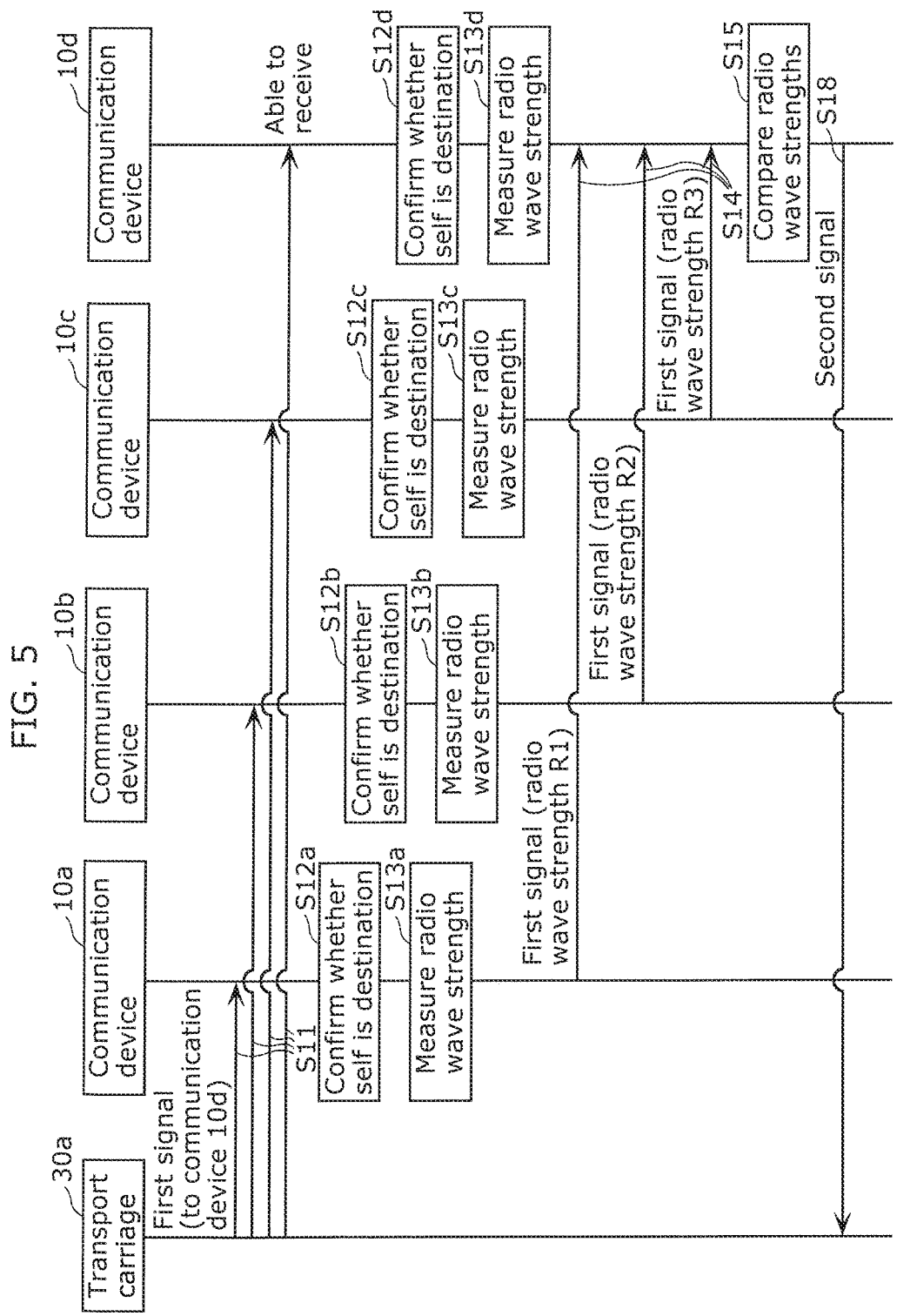
FIG. 5 is a sequence chart illustrating a second example of a communication method of the transport system according to Preferred Embodiment 1 of the present invention.

The first example of the communication method of transport system 1 described a communication method of transport system 1 in a case where the specific communication device 10d is not able to receive the first signal from the specific transport carriage 30a directly. With reference to FIG. 5, the following will describe a case where the specific communication device 10*d* has successfully received the first signal from the specific transport carriage 30*a* in step S11.

FIG. 5 is a sequence chart illustrating a second example of a communication method of transport system 1 according to Preferred Embodiment 1. The second example differs from the first example in that the specific communication device 10*d* has successfully received the first signal from the specific transport carriage 30*a* in step S11, and in terms of the operations performed by the specific communication device 10*d* as a result. As such, descriptions of identical points will be omitted as appropriate, and will focus instead on the different points.

Like the other communication devices 10*a* to 10*c*, controller 13 of the specific communication device 10*d* confirms whether or not the destination included in the first signal received by first communicator 12 from the specific transport carriage 30 is the specific communication device 10*d* including that controller 13 (step S12*d*). Here, the destination is communication device 10*d*, and thus controller 13 of the specific communication device 10*d* confirms that the destination is the specific communication device 10*d* including that controller 13.

Additionally, like the other communication devices 10*a* to 10*c*, controller 13 of the specific communication device 10*d* confirms the radio wave strength when first communicator 12 receives the first signal from the specific transport carriage 30*a* (step S13*d*). For example, the specific communication device 10*d* measures radio wave strength R4 when receiving the first signal.

Here, controller 13 of the specific communication device 10*d* determines whether or not the measured radio wave strength R4 is at least a predetermined radio wave strength threshold which is a level at which communication failures do not occur when the specific communication device 10*d* and the specific transport carriage 30*a* communicate.

When, for example, radio wave strength R4 is less than the predetermined radio wave strength threshold, there is a risk that the transmission and reception of the first signal and the second signal will fail due to a communication failure if the specific communication device 10*d* and the specific transport carriage 30*a* communicate directly. Accordingly, when radio wave strength R4 is less than the predetermined radio wave strength threshold, controller 13 of the specific communication device 10*d* waits, for a predetermined time, for the first signal to be transferred from the other communication devices 10*a* to 10*c*. The predetermined time may, for example, be a time determined based on the time information included in the first signal, or may be determined in advance. The same or similar processing as the processing in the first example is performed thereafter. For example, when radio wave strength R4 is the strongest of radio wave strengths R1 to R4, the specific communication device 10*d* transmits the second signal to the specific transport carriage 30*a* through a communication channel which does not pass through the other communication devices 10*a* to 10*c*, that is, directly from the specific communication device 10*d* (step S18).

When, for example, radio wave strength R4 is at least the predetermined strength threshold, it is unlikely that the transmission and reception of the first signal and the second signal will fail due to a communication failure even if the specific communication device 10*d* and the specific transport carriage 30 communicate directly. Accordingly, when radio wave strength R4 is at least the predetermined radio wave strength threshold, controller 13 of the specific communication device 10*d* does not wait for the first signal to be transferred from the other communication devices 10*a* to 10*c*. In other words, the processing of steps S14 and S15 indicated in FIG. 5 need not be performed. Thereafter, the specific communication device 10*d* transmits the second signal to the specific transport carriage 30*a* directly from the specific communication device 10*d* (step S18).

In the communication method of transport system 1 described with reference to FIGS. 4 and 5, the specific communication device 10*d* receives the first signal from the specific transport t carriage 30*a* through a communication channel that passes through the other communication devices 10*a* to 10*c* belonging to the same group A. However, the first signal may be received through another communication channel different from the communication channels which pass through the other communication devices 10*a* to 10*c*. This will be described with reference to FIGS. 3 and 6.

Figure 6:
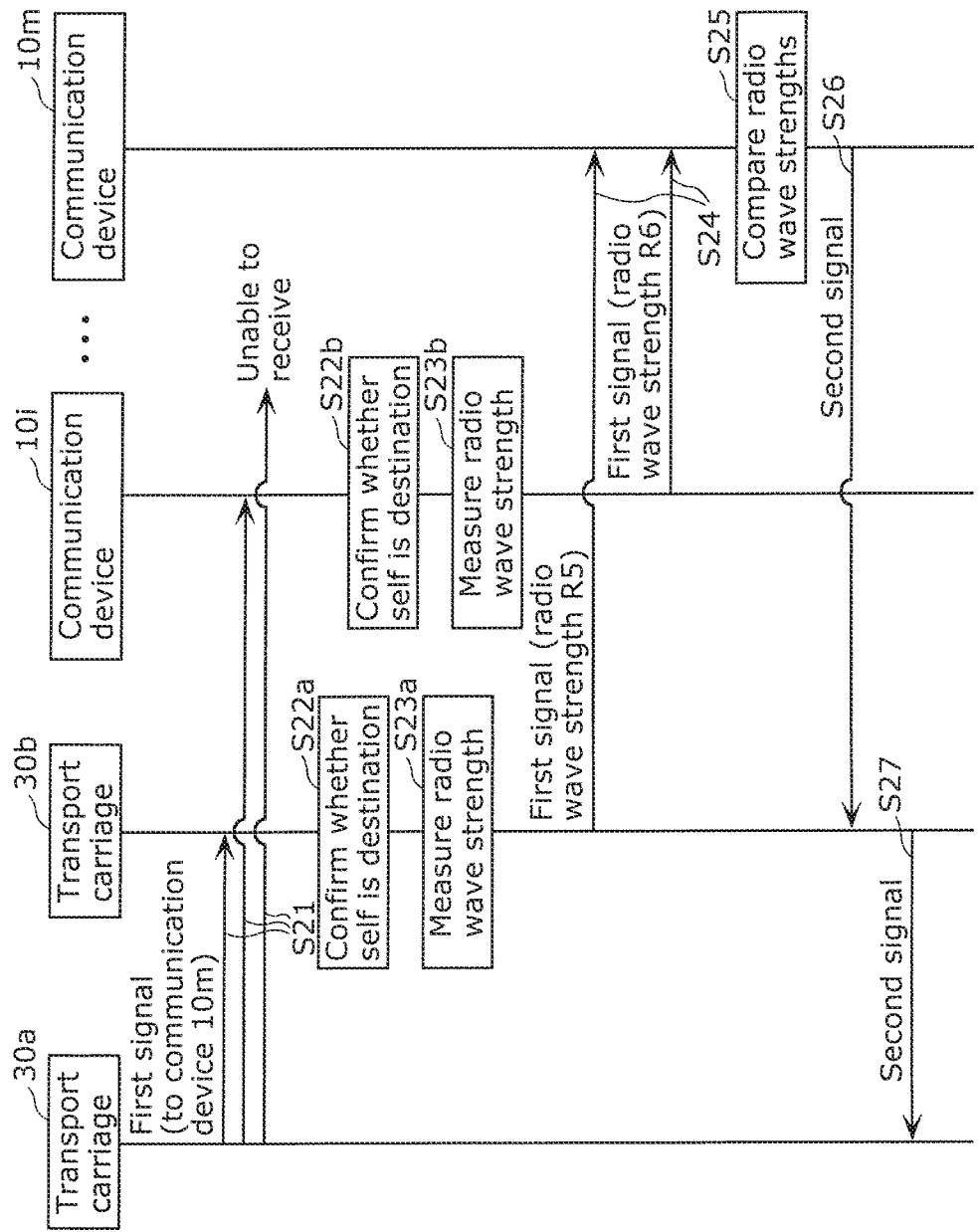
FIG. 6 is a sequence chart illustrating a third example of a communication method of the transport system according to Preferred Embodiment 1 of the present invention.

FIG. 6 is a sequence chart illustrating a third example of a communication method of transport system 1 according to Preferred Embodiment 1. Here, the specific transport carriage 30 that performs the interlock processing is transport carriage 30*a*. Furthermore, loading port 20 with which the specific transport carriage 30*a* transfers FOUP 100 is loading port 20*m* illustrated in FIG. 3. In other words, the specific communication device 10 which is the destination of the first signal is communication device 10*m*, which is connected one-to-one with loading port 20*m*. In the following, of the plurality of communication devices 10*i* to 10*m* illustrated in FIG. 3, communication devices 10 aside from the specific communication device 10*m* will be called "other communication devices 10*i* to 10*k*". Additionally, transport carriages 30 excluding the specific transport carriage 30*a* among the plurality of transport carriages 30 will also be called "the other transport carriage 30*b*". For example, in the communication with the specific communication device 10*m*, the other transport carriage 30*b* is in a position where it is less likely for a communication failure to occur than the specific transport carriage 30*a*. The plurality of transport carriages 30 are communicably connected to each other in advance. Here, for example, the transport carriages 30*a* and 30*b* belong to one group.

In the third example, carriage controller 32 transmits the first signal, which includes the interlock processing execution command, to the other transport carriage 30*b* using carriage communicator 33. Carriage controller 32 also transmits, when the first signal transmitted from the specific transport carriage 30*a* has been received from carriage communicator 33, the first signal to the specific communication device 10*m*. The first signal includes the address information of the final transmission destination as described above, and thus the other transport carriage 30*b* is able to transmit the first signal to the specific communication device 10*m*.

First, the specific transport carriage 30*a* among the plurality of transport carriages 30 transmits the first signal which has a final transmission destination of the specific communication device 10*m* to at least one of the plurality of communication devices 10*i* to 10*m* among the plurality of communication devices 10*i* to 10*m* and the other transport carriage 30*b* (step S21). Here, the specific transport carriage 30*a* broadcasts the first signal to both the plurality of communication devices 10*i* to 10*m* and the other transport carriage 30*b*. For example, first communicator 12 of the other communication device 10*i* has successfully received the first signal from the specific transport carriage 30*a*. However, communication device 10*m*, which is the final transmission destination, has not successfully received the first signal from the specific transport carriage 30*a* due to a communication failure. Additionally, the other transport carriage 30b has successfully received the first signal from the specific transport carriage 30a.

Next, carriage controller 32 of the other transport carriage 30b that has received the first signal confirms the destination included in the first signal received from the specific transport carriage 30a by carriage communicator 33 (step S22a), and controller 13 of the other communication device 10i confirms whether or not the destination included in the first signal received from the specific transport carriage 30a by first communicator 12 is the other communication device 10i including that controller 13 (step S22b). Here, the destination is communication device 10m. As such, carriage controller 32 confirms that the destination is communication device 10m, and controller 13 confirms that the destination is communication device 10m as opposed to controller 13 of the other communication device 10i. Accordingly, in step S24 (described later), the other transport carriage 30b and the other communication device 10i transmit, to the specific communication device 10m, the first signal received from the specific transport carriage 30a through communication channels that pass through the other transport carriage 30b and the other communication device 10i.

Additionally, carriage controller 32 of the other transport carriage 30b confirms the radio wave strength when carriage communicator 33 receives the first signal from the specific transport carriage 30a (step S23a), and controller 13 of the other communication device 10i confirms the radio wave strength when first communicator 12 receives the first signal from the specific transport carriage 30a (step S23b). For example, the other transport carriage 30b measures radio wave strength R5 when receiving the first signal, and the other communication device 10i measures radio wave strength R6 when receiving the first signal. Carriage controller 32 of the other transport carriage 30b then processes the first signal received by the corresponding carriage communicator 33 to include the measured radio wave strength R5 in the first signal. Additionally, controller 13 of the other communication device 10i then processes the first signal received by the corresponding first communicator 12 to include the measured radio wave strength R6 in the first signal. Accordingly, the first signal transmitted by the other transport carriage 30b and the other communication device 10i in step S24, described later, includes the radio wave strengths at which the signal was received.

The other transport carriage 30b then transmits the first signal including radio wave strength R5 to communication device 10m, which is the final transmission destination. Communication device 10i also transmits the first signal, including radio wave strength R6, to communication device 10m, which belongs to the same group C as communication device 10i and which is the final transmission destination.

As described in the first example with reference to FIG. 4, in addition to the address information of the specific communication device 10m which is the final transmission destination, the first signal transmitted by the specific transport carriage 30a to the plurality of communication devices 10i to 10m and the other transport carriage 30b may also include time information identifying a time to transmit the first signal to the specific communication device 10m when the other transport carriage 30b belonging to the same group as the other communication devices 10i to 10k and the specific transport carriage 30a, which belong to the same group C as the specific communication device 10m, has received the first signal.

Accordingly, a situation where each of the other communication devices 10i to 10k and the other transport carriage 30b transmits the first signal to the specific communication device 10m at the same time is able to be significantly reduced or prevented, and thus the occurrence of is able to be significantly reduced or prevented.

Therefore, by the other communication device 10i and the other transport carriage 30b transmitting the first signal to the specific communication device 10m, the specific communication device 10m receives the first signal from each of the other communication device 10i and the other transport carriage 30b. In other words, the specific communication device 10m receives the first signal through at least one of a communication channel that passes through the other communication device 10i and a communication channel that passes through the other transport carriage 30b (both, here) (step S24). The communication channel that passes through the other transport carriage 30b is a communication channel defined by a channel through which the specific transport carriage 30a and the other transport carriage 30b communicate and a channel through which the other transport carriage 30b and the specific communication device 10m communicate, and is a channel which is different from the channel through which the specific communication device 10m communicates directly with the specific transport carriage 30a.

Accordingly, even if the specific communication device 10m is not able to receive the first signal directly from the specific transport carriage 30a due to a communication failure, the specific communication device 10m is able to indirectly receive the first signal through at least one of the communication channel that passes through the other communication device 10i and the communication channel that passes through the other transport carriage 30b. Therefore, redundant wireless communication is able to be provided in the interlock communication in transport system 1.

The specific communication device 10m transmits the first signal to the specific loading port 20m connected one-to-one to the specific communication device 10m. Having received the first signal, loading port 20m confirms whether or not loading port 20m is currently in a state in which transfer is possible. Loading port 20m then returns, to the specific communication device 10m, the second signal indicating whether or not loading port 20m is currently in a state in which transfer is possible.

The specific communication device 10m transmits the second signal, which is a response signal responding to the first signal received from the loading port 20m, to the specific transport carriage 30a. At that time, controller 13 of the specific communication device 10m compares radio wave strengths R5 and R6, which are included in the first signals transmitted from the other communication device 10i and the other transport carriage 30b (step S25). Then, for example, controller 13 of the specific communication device 10m determines that radio wave strength R5 is the strongest of radio wave strengths R5 and R6.

The specific communication device 10m transmits the second signal to the specific transport carriage 30a through the communication channel that passes through the other transport carriage 30b, which corresponds to radio wave strength R5 that is the strongest of radio wave strengths R5 and R6. In other words, the specific communication device 10m transmits the second signal to the other transport carriage 30b (step S26), and the other transport carriage 30b transmits the second signal transmitted from the specific communication device 10m to the specific transport carriage 30a (step S27).

Accordingly, the second signal is transmitted through the communication channel, of the communication channels which pass through the other communication device 10*i* and the other transport carriage 30*b*, that has the strongest radio wave strength, and the likelihood that the communication between the specific transport carriage 30*a* and the specific communication device 10*m* will succeed is able to be significantly increased.

Preferred Embodiment 2 of the present invention will now be described. In the present preferred embodiment, two communication devices 10 are provided as the plurality of communication devices communicably connected to each other in advance. Accordingly, the plurality of communication devices need not be three or more devices, as described in Preferred Embodiment 1, and may instead be two devices, as in the present preferred embodiment. In this case, one of communication devices 10 is a specific communication device 10, and the other is one of the other communication devices 10. There is therefore no risk of collisions when the other communication device 10 transmits the first signal s to the specific communication device 10, and thus the first signal need not include the time information. Additionally, when there is one other communication device 10, the radio wave strengths are not able to be compared with two or more other communication devices 10, and thus the first signal need not include the radio wave strength.

Although a communication method, transport system 1, and communication device 10 according to the present invention have been described with respect to the preferred embodiments, the present invention is not limited to the foregoing preferred embodiments. Variations on the present preferred embodiment conceived by one skilled in the art and preferred embodiments implemented by combining elements from different other preferred embodiments, for as long as they do not depart from the spirit of the present invention, fall within the scope of the present invention.

For example, although communication device 10 is installed on a floor side of semiconductor manufacturing apparatus 50 in the foregoing preferred embodiments, communication device 10 may be installed on a ceiling side instead. In this case, in the communication between communication device 10 and transport carriage 30, which travels along travel route 2 provided on the ceiling side of a semiconductor manufacturing factory or the like, the distance between transport carriage 30 and communication device 10 is shorter, and the surrounding environment and the like therefore have less influence on the communication. Therefore, radio wave strength is able to be increased. However, according to the present invention, redundant wireless communication in the interlock communication of transport system 1 is able to be provided even if the radio wave strength between communication device 10 and transport carriage 30 is weak (that is, in a state where a communication failure may occur). Thus, according to the preferred embodiments of the present invention, placing restrictions on the location where communication device 10 is installed is able to be avoided, and the freedom of installation and eliminate problems caused by communication failures is able to be significantly increased.

Additionally, for example, although communication device 10 is installed near loading port 20 in the foregoing preferred embodiments as illustrated in FIGS. 1 and 3, communication device 10 need not be installed near loading port 20 as long as communication device 10 and loading port 20 are connected one-to-one.

Additionally, for example, although the equipment connected one-to-one to communication device 10 is loading port 20 in the foregoing preferred embodiments, the equipment is not limited thereto. The equipment may be semiconductor manufacturing apparatus 50, for example. In other words, each of the plurality of communication devices 10 may be connected one-to-one to corresponding ones of a plurality of semiconductor manufacturing apparatuses 50, and a single communication device 10 may handle a plurality of loading ports 20. In this case, the first signal includes not only the address information of the specific communication device 10 that is the final transmission destination, but also address information and the like of loading port 20, among the plurality of loading ports 20 of a specific semiconductor manufacturing apparatus 50, to and from which transfers will be performed.

Additionally, for example, the equipment may be a group of semiconductor manufacturing apparatuses 50 which takes a collection of a plurality of semiconductor manufacturing apparatuses 50 as a single unit. In other words, each of the plurality of communication devices 10 may be connected one-to-one to a corresponding group of a plurality of semiconductor manufacturing apparatuses 50, and a single communication device 10 may handle a plurality of semiconductor manufacturing apparatuses 50. In this case, the first signal includes not only the address information of the specific communication device 10 that is the final transmission destination, but also address information of semiconductor manufacturing apparatus 50, in a specific group of semiconductor manufacturing apparatuses 50, in which loading port 20 to and from which transfers will be performed is provided, as well as address information and the like of that loading port 20.

Additionally, for example, the equipment may be a group of loading ports 20 which takes a collection of a plurality of loading ports 20 as a single unit. In other words, each of the plurality of communication devices 10 may be connected one-to-one to a corresponding group of a plurality of loading ports 20. In other words, a single communication device 10 may be connected one-to-one to a collection of a plurality of loading ports 20.

Furthermore, the equipment need not be loading port 20, semiconductor manufacturing apparatus 50, or the like involved in semiconductor manufacturing. For example, the equipment may be an item unrelated to semiconductor manufacturing, such as a placement stand.

Additionally, for example, although the first signal includes the time information identifying the time at which each of the other communication devices 10 are to transmit the first signal to the specific communication device 10 in the foregoing preferred embodiments, the first signal need not include the time information.

Additionally, for example, although the first signal includes the radio wave strength when each of the other communication devices 10 receives the first signal from the specific transport carriage 30 the foregoing preferred embodiments, the first signal need not include the radio wave strength. In this for case, example, the specific communication device 10 may transmit the second signal to the specific transport carriage 30 through communication channels that pass through each of the other communication devices 10 which have transmitted the first signal to the specific communication device 10. In other words, the specific communication device 10 may transmit the second signal to the specific transport carriage 30 through the communication channels of all communication devices 10 which are successfully communicating with the specific transport carriage 30 directly, regardless of the radio wave strength. In this case, the second signal may include time information identifying a time at which each of the other communication devices 10 is to transmit the second signal to the specific transport carriage 30, and each of the other communication devices 10 may transmit the second signal to the specific transport carriage 30 at the time identified by that time information. Accordingly, a situation where each of the other communication devices 10 transmits the second signal to the specific transport carriage 30 at the same time is able to be significantly reduced or prevented, and thus the occurrence of collisions is able to be significantly reduced or prevented.

Additionally, for example, although the specific transport carriage 30 transmits the first signal to both the plurality of communication devices 10 and the other transport carriage 30 in the third example described in the foregoing preferred embodiment, the first signal may instead be transmitted only to the other transport carriage 30, without being transmitted to the plurality of communication devices 10.

Additionally, for example, although the other transport carriage 30 is only the one transport carriage 30b in the third example described in the foregoing preferred embodiment, there may be a plurality of the other transport carriages 30. In this case, carriage controllers 32 of the plurality of other transport carriages 30 which have received the first signal confirm the destination included in the first signal received by carriage communicators 33 from the specific transport carriage 30a; carriage controllers 32 of the plurality of other transport carriages 30 confirm the radio wave strengths when carriage communicators 33 receive the first signal from the specific transport carriage 30a; and the specific communication device 10m receives the first signal through at least one of a communication channel that passes through the other communication device 301 and a communication channel that passes through the plurality of other transport carriages 30.

Additionally, for example, the steps in the communication method of transport system 1 may be executed by a computer (a computer system). The present invention is then able to be implemented as a program to cause a computer to perform the steps included in the method. Furthermore, the present invention is able to be implemented as a non-transitory computer-readable recording medium, for example, a CD-ROM, in which the program is recorded.

For example, when the present invention is implemented by a program (software), each step is performed by executing the program using hardware resources such as a central processing unit (CPU), memory, and input/output circuitry of the computer. In other words, each step is executed by the CPU obtaining data from the memory, the input/output circuitry, and the like and performing computations, outputting computation results to the memory, the input/output circuitry, and the like, and the like.

Each of the plurality of elements included in transport system 1 of the foregoing preferred embodiments may be implemented as a dedicated or general-purpose circuit. These elements may be implemented as a single circuit or as a plurality of circuits.

Additionally, the plurality of elements included in transport system 1 of the foregoing preferred embodiments may be implemented through LSI (Large-Scale Integration), which is a format used for integrated circuits (ICs). These elements are able to be implemented individually as single chips, or may be implemented with a single chip including some or all of the elements. LSI may be referred to as "system LSI", "super LSI", or "ultra LSI" depending on the degree of integration.

The integrated circuit is not limited to LSI, and may be implemented as dedicated circuits or general-purpose processors. As described above, a programmable FPGA or a reconfigurable processor where the connections and configurations of circuit cells within the LSI can be reconfigured may be used.

Furthermore, if other technologies that improve upon or are derived from semiconductor technology provide integration technology to replace LSI, those technologies may be applied to create integrated circuits for the elements included in transport system 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A communication method of a transport system, the transport system including a plurality of transport carriages, each transporting a transported object, and a plurality of communication devices connected one-to-one with corresponding ones of a plurality of equipment onto which the transported objects are loaded, the plurality of communication devices being communicably connected to each other in advance, the communication method comprising:
   (a) transmitting, from a specific transport carriage among the plurality of transport carriages to the plurality of communication devices, a first signal having a specific communication device among the plurality of communication devices as a final transmission destination; and
   (b) receiving, in the specific communication device, the first signal from the specific transport carriage through a communication channel that passes through at least one other communication device among the plurality of communication devices; wherein
   the first signal is a signal communicated for the specific transport carriage to transfer the transported object to and from a specific one of the equipment which is connected one-to-one with the specific communication device;
   the plurality of communication devices includes at least three communication devices;
   the first signal includes time information identifying a time for each of the at least one other communication device to transmit the first signal to the specific communication device; and
   in (b), each of the at least one other communication device transmits the first signal to the specific communication device at the time identified by the time information.

2. The communication method according to claim 1, wherein the plurality of communication devices are connected to each other by a hardwire cable.

3. A communication method of a transport system, the transport system including a plurality of transport carriages, each transporting a transported object, and a plurality of communication devices connected one-to-one with corresponding ones of a plurality of equipment onto which the transported objects are loaded, the plurality of communication devices being communicably connected to each other in advance, the communication method comprising:
   (a) transmitting, from a specific transport carriage among the plurality of transport carriages to the plurality of communication devices, a first signal having a specific communication device among the plurality of communication devices as a final transmission destination; and
   (b) receiving, in the specific communication device, the first signal from the specific transport carriage through a communication channel that passes through at least one other communication device among the plurality of communication devices: wherein the first signal is a signal communicated for the specific transport carriage to transfer the transported object to and from a specific one of the equipment which is connected one-to-one with the specific communication device;

in (b), each of the at least one other communication device transmits the first signal to the specific communication device; and the communication method further includes (c) transmitting a second signal from the specific communication device to the specific transport carriage through a communication channel passing through the at least one other communication device, the second signal being a response signal responding to the first signal.

4. The communication method according to claim 3, wherein:

the plurality of communication devices includes at least three communication devices;

the first signal includes a radio wave strength at which each of the at least one other communication device has received the first signal from the specific transport carriage;

in (b), each of the at least one other communication device transmits the first signal including the radio wave strength to the specific communication device; and in (c), the specific communication device transmits the second signal to the specific transport carriage through a communication channel that passes through a communication device, among the at least one other communication device, that corresponds to the radio wave strength that is the strongest radio wave strength included in the first signal transmitted by the at least one other communication device.

5. The communication method according to claim 3, wherein the plurality of communication devices are connected to each other by a hardwire cable.

6. A transport system comprising:

a plurality of transport carriages, each transporting a transported object; and a plurality of communication devices connected one-to-one with corresponding ones of a plurality of equipment onto which the transported objects are loaded, and the plurality of communication devices being communicably connected to each other in advance; wherein a specific transport carriage among the plurality of transport carriages transmits, to the plurality of communication devices, a first signal having a specific communication device among the plurality of communication devices as a final transmission destination;

the specific communication device receives the first signal from the specific transport carriage through a communication channel that passes through at least one other communication device among the plurality of communication devices; and the first signal is a signal communicated for the specific transport carriage to transfer the transported object to and from a specific one of the equipment which is connected one-to-one with the specific communication device;

the plurality of communication devices includes at least three communication devices;

the first signal includes time information identifying a time for each of the at least one other communication device to transmit the first signal to the specific communication device; and the specific communication device receives the first signal from the specific transport carriage through a communication channel passing through the at least one other communication device by each of the at least one other communication device transmitting the first signal to the specific communication device at the time identified by the time information.

7. The transport system according to claim 6, wherein the plurality of communication devices are connected to each other by a hardwire cable.

8. A transport system comprising:

a plurality of transport carriages, each transporting a transported object; and a plurality of communication devices connected one-to-one with corresponding ones of a plurality of equipment onto which the transported objects are loaded, and the plurality of communication devices being communicably connected to each other in advance; wherein a specific transport carriage among the plurality of transport carriages transmits, to the plurality of communication devices, a first signal having a specific communication device among the plurality of communication devices as a final transmission destination;

the specific communication device receives the first signal from the specific transport carriage through a communication channel that passes through at least one other communication device among the plurality of communication devices; and the first signal is a signal communicated for the specific transport carriage to transfer the transported object to and from a specific one of the equipment which is connected one-to-one with the specific communication device;

the specific communication device receives the first signal from the specific transport carriage through a communication channel passing through the at least one other communication device by each of the at least one other communication device transmitting the first signal to the specific communication device; and the specific communication device transmits a second signal to the specific transport carriage through a communication channel passing through the at least one other communication device, the second signal being a response signal responding to the first signal.

9. The transport system according to claim 8, wherein:

the plurality of communication devices includes at least three communication devices;

the first signal includes a radio wave strength at which each of the at least one other communication device has received the first signal from the specific transport carriage;

the specific communication device receives the first signal from the specific transport carriage through a communication channel passing through the at least one other communication device by each of the at least one other communication device transmitting the first signal including the radio wave strength to the specific communication device; and the specific communication device transmits the second signal to the specific transport carriage through a communication channel that passes through a communication device, among the at least one other communication device, that corresponds to the radio wave strength that is the strongest radio wave strength included in the first signal transmitted by the at least one other communication device.

10. The transport system according to claim 8, wherein the plurality of communication devices are connected to each other by a hardwire cable.

11. A communication device in a transport system, the transport system including a plurality of transport carriages, each transporting a transported object, and a plurality of the communication devices connected one-to-one with corresponding ones of a plurality of equipment onto which the transported objects are loaded, and the plurality of communication devices being communicably connected to each other in advance, wherein
when a specific transport carriage among the plurality of transport carriages has transmitted, to the plurality of communication devices, a first signal having the communication device among the plurality of communication devices as a final transmission destination, the communication device receives the first signal from the specific transport carriage through a communication channel passing through at least one other communication device among the plurality of communication devices; and
the first signal is a signal communicated for the specific transport carriage to transfer the transported object to and from a specific one of the equipment which is connected one-to-one with the communication device;
the plurality of communication devices includes at least three communication devices;
the first signal includes time information identifying a time for each of the at least one other communication device to transmit the first signal to the communication device; and
the communication device receives the first signal from the specific transport carriage through a communication channel passing through the at least one other communication device by each of the at least one other communication device transmitting the first signal to the communication device at the time identified by the time information.

12. The communication device according to claim 11, wherein the plurality of communication devices are connected to each other by a hardwire cable.

13. The communication device according to claim 11, wherein when a specific transport carriage among the plurality of transport carriages has transmitted, to the plurality of communication devices, a first signal having as a final transmission destination a specific communication device, among the plurality of communication devices, that is different from the communication device, the communication device transmits the first signal received from the transport carriage to the specific communication device.

14. A communication device in a transport system, the transport system including a plurality of transport carriages, each transporting a transported object, and a plurality of the communication devices connected one-to-one with corresponding ones of a plurality of equipment onto which the transported objects are loaded, and the plurality of communication devices being communicably connected to each other in advance, wherein
when a specific transport carriage among the plurality of transport carriages has transmitted, to the plurality of communication devices, a first signal having the communication device among the plurality of communication devices as a final transmission destination, the communication device receives the first signal from the specific transport carriage through a communication channel passing through at least one other communication device among the plurality of communication devices; and
the first signal is a signal communicated for the specific transport carriage to transfer the transported object to and from a specific one of the equipment which is connected one-to-one with the communication device;
the communication device receives the first signal from the specific transport carriage through a communication channel passing through the at least one other communication device by each of the at least one other communication device transmitting the first signal to the communication device; and
the communication device transmits a second signal to the specific transport carriage through a communication channel passing through the at least one other communication device, the second signal being a response signal responding to the first signal.

15. The communication device according to claim 14, wherein:
the plurality of communication devices includes at least three devices;
the first signal includes a radio wave strength at which each of the at least one other communication device has received the first signal from the specific transport carriage;
the communication device receives the first signal from the specific transport carriage through a communication channel passing through the at least one other communication device by each of the at least one other communication device transmitting the first signal including the radio wave strength to the communication device; and
the communication device transmits the second signal to the specific transport carriage through a communication channel that passes through a communication device, among the at least one other communication device, that corresponds to the radio wave strength that is the strongest radio wave strength included in the first signal transmitted by the at least one other communication device.

16. The communication device according to claim 14, wherein the plurality of communication devices are connected to each other by a hardwire cable.

17. The communication device according to claim 14, wherein when a specific transport carriage among the plurality of transport carriages has transmitted, to the plurality of communication devices, a first signal having as a final transmission destination a specific communication device, among the plurality of communication devices, that is different from the communication device, the communication device transmits the first signal received from the transport carriage to the specific communication device.

18. A communication method of a transport system, the transport system including a plurality of transport carriages, each transporting a transported object, and a plurality of communication devices connected one-to-one with corresponding ones of a plurality of equipment onto which the transported objects are loaded, the communication method comprising:
(a) transmitting, from a specific transport carriage among the plurality of transport carriages to at least one of (i) the plurality of communication devices and (ii) at least one other transport carriage of the plurality of transport carriages, a first signal having a specific communication device among the plurality of communication devices as a final transmission destination; and (b) receiving, in the specific communication device, the first signal through at least one of a communication channel passing through at least one other communication device among the plurality of communication devices and a communication channel passing through the at least one other transport carriage; wherein the first signal is a signal communicated for the specific transport carriage to transfer the transported object to and from a specific one of the equipment which is connected one-to-one with the specific communication device;

the plurality of communication devices includes at least three communication devices;

the first signal includes time information identifying a time for each of the at least one other communication device to transmit the first signal to the specific communication device; and in (b), each of the at least one other communication device transmits the first signal to the specific communication device at the time identified by the time information.

19. The communication method according to claim 18, wherein the plurality of communication devices are connected to each other by a hardwire cable.

20. A communication method of a transport system, the transport system including a plurality of transport carriages, each transporting a transported object, and a plurality of communication devices connected one-to-one with corresponding ones of a plurality of equipment onto which the transported objects are loaded, the communication method comprising:

(a) transmitting, from a specific transport carriage among the plurality of transport carriages to at least one of (i) the plurality of communication devices and (ii) at least one other transport carriage of the plurality of transport carriages, a first signal having a specific communication device among the plurality of communication devices as a final transmission destination; and (b) receiving, in the specific communication device, the first signal through at least one of a communication channel passing through at least one other communication device among the plurality of communication devices and a communication channel passing through the at least one other transport carriage; wherein the first signal is a signal communicated for the specific transport carriage to transfer the transported object to and from a specific one of the equipment which is connected one-to-one with the specific communication device;

in (b), each of the at least one other communication device transmits the first signal to the specific communication device; and the communication method further includes (c) transmitting a second signal from the specific communication device to the specific transport carriage through a communication channel passing through the at least one other communication device, the second signal being a response signal responding to the first signal.

21. The communication method according to claim 20, wherein the plurality of communication devices are connected to each other by a hardwire cable.

22. The communication method according to claim 20, wherein:

the plurality of communication devices includes at least three communication devices;

the first signal includes a radio wave strength at which each of the at least one other communication device has received the first signal from the specific transport carriage;

in (b), each of the at least one other communication device transmits the first signal including the radio wave strength to the specific communication device; and in (c), the specific communication device transmits the second signal to the specific transport carriage through a communication channel that passes through a communication device, among the at least one other communication device, that corresponds to the radio wave strength that is the strongest radio wave strength included in the first signal transmitted by the at least one other communication device.

* * * * *